(12) United States Patent
Moore

(10) Patent No.: US 8,559,901 B2
(45) Date of Patent: *Oct. 15, 2013

(54) METHOD FOR CONTROLLING CHANNEL RE-SELECTION

(75) Inventor: Michael P. Moore, Redmond, WA (US)

(73) Assignee: AT&T Mobility II LLC, Atlanta, GA (US)

(*) Notice: Subject to any disclaimer, the term of this patent is extended or adjusted under 35 U.S.C. 154(b) by 435 days.

This patent is subject to a terminal disclaimer.

(21) Appl. No.: 12/603,964

(22) Filed: Oct. 22, 2009

(65) Prior Publication Data

US 2010/0041401 A1 Feb. 18, 2010

Related U.S. Application Data

(63) Continuation of application No. 12/262,513, filed on Oct. 31, 2008, now Pat. No. 7,616,933, which is a continuation of application No. 10/921,822, filed on Aug. 20, 2004, now Pat. No. 7,447,487, which is a continuation of application No. 10/206,963, filed on Jul. 30, 2002, now Pat. No. 6,850,744, which is a continuation of application No. 09/306,760, filed on May 7, 1999, now Pat. No. 6,501,951, which is a continuation of application No. 08/772,829, filed on Dec. 24, 1996, now Pat. No. 5,995,834.

(51) Int. Cl.
| | | |
|---|---|---|
| *H04B 1/18* | (2006.01) | |
| *H04W 4/00* | (2009.01) | |
| *H04W 74/00* | (2009.01) | |
| *H04B 7/00* | (2006.01) | |
| *H03J 1/00* | (2006.01) | |

(52) U.S. Cl.
CPC ............... *H03J 1/005* (2013.01); *H03J 1/0091* (2013.01)

USPC .................. 455/161.2; 455/165.1; 455/426.1; 455/429; 455/434; 455/455

(58) Field of Classification Search
USPC ........ 455/161.2, 165.1, 426.1, 429, 434, 455, 455/512
See application file for complete search history.

(56) References Cited

U.S. PATENT DOCUMENTS

| | | |
|---|---|---|
| 3,626,112 A | 12/1971 | Henquet |
| 3,898,390 A | 8/1975 | Wells et al. |

(Continued)

FOREIGN PATENT DOCUMENTS

| | | |
|---|---|---|
| CA | 2134695 | 5/1995 |
| CA | 2240262 | 5/1996 |
| CA | 2163937 | 6/1996 |

OTHER PUBLICATIONS

Canadian Search Report (Mar. 23, 2001).

(Continued)

*Primary Examiner* — William D Cumming
(74) *Attorney, Agent, or Firm* — Parks IP Law LLC; Jennifer P. Medlin, Esq.

(57) ABSTRACT

A mobile station including a processor and a memory storing program instructions. The instructions, when executed by the processor, cause the processor to determine if any candidate control channels of a list of candidate control channels are ineligible for selection by belonging to a private network to which the mobile station is not permitted access, analyze those candidate control channels not determined to be ineligible for selection to identify a primary candidate control channel, and attempt to select the primary candidate control channel.

21 Claims, 4 Drawing Sheets

(56) References Cited

U.S. PATENT DOCUMENTS

| | | | |
|---|---|---|---|
| 4,127,744 | A | 11/1978 | Yoshikawa et al. |
| 4,612,415 | A | 9/1986 | Zdunek et al. |
| 4,829,554 | A | 5/1989 | Barnes et al. |
| 4,905,301 | A | 2/1990 | Krolopp et al. |
| 4,916,728 | A * | 4/1990 | Blair ............................ 455/455 |
| 5,014,348 | A | 5/1991 | Boone et al. |
| 5,276,905 | A | 1/1994 | Hurst et al. |
| 5,301,357 | A | 4/1994 | Thompson |
| 5,329,575 | A | 7/1994 | Matsuda |
| 5,353,332 | A | 10/1994 | Raith et al. |
| 5,363,428 | A | 11/1994 | Nagashima |
| 5,408,684 | A | 4/1995 | Yunoki et al. |
| 5,442,680 | A | 8/1995 | Schellinger et al. |
| 5,526,402 | A * | 6/1996 | Dent et al. ................. 455/426.1 |
| 5,551,058 | A | 8/1996 | Hutcheson et al. |
| 5,640,677 | A | 6/1997 | Karlsson |
| 5,666,655 | A * | 9/1997 | Ishikawa et al. ............. 455/512 |
| 5,675,629 | A | 10/1997 | Raffel et al. |
| 5,754,956 | A | 5/1998 | Abreu et al. |
| 5,754,959 | A | 5/1998 | Ueno et al. |
| 5,774,807 | A | 6/1998 | Yazaki et al. |
| 5,778,316 | A | 7/1998 | Persson et al. |
| 5,794,147 | A | 8/1998 | Huang |
| 5,794,157 | A | 8/1998 | Haartsen |
| 5,805,581 | A | 9/1998 | Uchida et al. |
| 5,842,127 | A | 11/1998 | Pashtan et al. |
| 5,870,673 | A | 2/1999 | Haartsen |
| 5,884,184 | A | 3/1999 | Sheffer |
| 5,903,839 | A | 5/1999 | Martila |
| 5,907,806 | A | 5/1999 | Yamada et al. |
| 5,911,120 | A | 6/1999 | Jarett et al. |
| 5,940,743 | A | 8/1999 | Sunay et al. |
| 5,940,760 | A | 8/1999 | Uistola |
| 5,953,665 | A | 9/1999 | Mattila |
| 5,960,354 | A | 9/1999 | Einola |
| 5,991,622 | A | 11/1999 | Henry, Jr. |
| 5,995,834 | A * | 11/1999 | Moore .......................... 455/434 |
| 6,094,576 | A | 7/2000 | Hakkinen et al. |
| 6,144,653 | A | 11/2000 | Persson et al. |
| 6,259,915 | B1 | 7/2001 | Raith |
| 6,421,328 | B1 | 7/2002 | Larribeau et al. |
| 6,501,951 | B2 * | 12/2002 | Moore .......................... 455/434 |
| 6,633,754 | B1 | 10/2003 | Raith |
| 6,850,744 | B2 * | 2/2005 | Moore ....................... 455/165.1 |
| 7,050,771 | B2 | 5/2006 | Uistola |
| 7,447,487 | B2 * | 11/2008 | Moore ....................... 455/165.1 |
| 7,616,933 | B2 * | 11/2009 | Moore ....................... 455/161.2 |
| 2001/0044301 | A1 * | 11/2001 | Moore .......................... 455/429 |
| 2002/0183061 | A1 * | 12/2002 | Moore .......................... 455/434 |
| 2005/0020293 | A1 * | 1/2005 | Moore .......................... 455/515 |
| 2009/0061867 | A1 * | 3/2009 | Moore .......................... 455/434 |
| 2010/0041401 | A1 * | 2/2010 | Moore .......................... 455/434 |

OTHER PUBLICATIONS

Chang et al. "Performance of Personal Access Communications System Unlicensed B", IEEE J on Selected Areas in Communications (May 1996).

* cited by examiner

*FIG. 2*

| CONTROL CHANNEL ID | ELIGIBILITY STATUS | PARAMETER INFORMATION | | |
|---|---|---|---|---|
| | | PRIVATE STATUS | SERVICE DESCRIPTION | ○ ○ ○ |
| XXXXX | | PRIVATE | VOICE | ○ ○ ○ |
| YYYYY | | PUBLIC | VOICE | ○ ○ ○ |
| ZZZZZ | | PUBLIC | FAX | ○ ○ ○ |
| ⋮ | ⋮ | ⋮ | ⋮ | ○ ○ ○ |
| AAAAA | | PUBLIC | VOICE | ○ ○ ○ |

METHOD FOR CONTROLLING CHANNEL RE-SELECTION

CROSS REFERENCE TO RELATED APPLICATIONS

This application is a continuation of U.S. application Ser. No. 12/262,513, filed Oct. 31, 2008 now U.S. Pat. No. 7,616,933, which is a continuation of U.S. application Ser. No. 10/921,822, filed Aug. 20, 2004 (now U.S. Pat. No. 7,447,487), which is a continuation of U.S. application Ser. No. 10/206,963, filed Jul. 30, 2002 (now U.S. Pat. No. 6,850,744), which is a continuation of U.S. application Ser. No. 09/306,760, filed May 7, 1999 (now U.S. Pat. No. 6,501,951), which is a continuation of U.S. application Ser. No. 08/772,829, filed Dec. 24, 1996 (now U.S. Pat. No. 5,995,834), the contents of which are incorporated herein by reference in their entirety.

BACKGROUND

An exemplary embodiment is directed to a method for controlling control channel re-selection by a mobile communication station. More particularly, an exemplary embodiment relates to allowing the re-selection process to be conducted only with respect to those candidate control channels, onto which the mobile station is eligible to camp.

In the wireless communication environment it is known that as a mobile station moves throughout an area it is likely to encounter different cells that are serviced by different base stations. One example of a multi-cell wireless environment is illustrated in FIG. 1. There is a plurality of cells ($C_1$ to $C_{12}$) and each is served by a separate base station ($BS_1$ to $BS_{12}$). As a mobile station moves from one cell to another cell it is served by a different base station.

Typically the base stations operate with distinct control channels, voice channels or data channels. It is known that during a communication, such as a call, as a mobile station passes from one cell to another it is handed off from one base station to another according to a certain protocol. However, in an activated state where a call is not in process, while the mobile station is in a cell, it is camped on a control channel, i.e., it is in essence tuned to that channel and prepared to engage in communications of control information over that channel. The mobile station must execute a process for selecting another control channel as the mobile station moves from cell to cell. This is called a re-selection process.

In the wireless environment) a known standard referred to as the IS-136 Standard defines protocols for digital wireless communications involving digital mobile stations. That standard defines a process by which the mobile station can re-select a control channel as it moves among the cells. In that process the mobile station is presumed to be "camped-on" to a first control channel. That control channel then transmits a list of the neighboring control channels, that is the list of control channels for the neighboring cells (or service providers). The mobile station receives the list and stores it. Then in accordance with a prescribed algorithm, the mobile station determines which one of the control channels on the list constitutes the primary candidate for re-selection. This determination is made based on such things as reading the RF (Radio Frequency) level of the various control channels in the list and determining which is the control channel that the mobile station should try to select next. For example, if the mobile station was in cell $C_2$ moving towards cell $C_1$, it may detect that the next strongest control channel among the neighbors of cell $C_2$ originates from base station $BS_1$ and therefore would deem that control channel to be the primary candidate for re-selection.

Further, in accordance with the algorithm described in the IS-136 standard once a primary candidate has been determined the mobile station attempts to re-select to that control channel. If the re-selection attempt is successful, then the mobile station camps onto the new control channel, receives a new list of neighboring control channels and begins the process all over with the new list of neighbors. If the attempt is unsuccessful, then the mobile station either selects the next appropriate candidate channel (that is a secondary candidate channel) or repeats the analysis of the entire list of candidate channels attempting to determine another primary candidate channel for re-selection.

A problem arises in that when the mobile station receives the neighbor list, it may include control channels with which the mobile station is simply incompatible. For example, the list may include one or more channels that are related to private systems and a mobile station may not be permitted access to those private systems. Alternatively, the mobile station may be seeking voice service and the control channels may be directed to data or fax services. Nonetheless, based on the parameters used in the analysis algorithm, these control channels with which the mobile station cannot truly interact are included in the analysis operation and one of these incompatible control channels could be selected as the primary candidate control channel. Naturally when this occurs, the attempt to re-select to that control channel will fail. Thus, the execution of the process has wasted time and resources toward the attempt to re-select an incompatible control channel. Furthermore, under the known algorithms, once the attempt to re-select to the incompatible control channel has failed that channel is still included in the next cycle of the re-selection process and could be once again selected as the primary candidate control channel. It is conceivable that the mobile station could get caught in an extended loop of determining an incompatible control channel to be the primary candidate control channel and making a failed attempt to re-select to that control channel.

In view of the shortcomings of the known re-selection process, it is desirable to provide further controls in the re-selection process to avoid the attempt to re-select to incompatible control channels. It is also desirable to avoid second attempts to re-select to control channels which are determined to be incompatible with the mobile station during a re-select attempt.

SUMMARY

In accordance with the disclosure, a mobile station performs a method for controlling the re-selection of a control channel. In that method the mobile station, prior to performing an algorithm for selecting a primary candidate control channel, marks as ineligible, any one of the control channels identified on the neighbor list which are incompatible with the mobile station. The selection of a primary control channel then proceeds only with regard to those control channels which are determined to be eligible. Once a primary candidate control channel is selected the mobile station attempts to re-select to that primary candidate control channel. If the attempt to re-select is successful, then the mobile station camps on to this control channel. If, however, the attempt fails, then the mobile station determines why the attempt failed. If the failure arises from an incompatibility between the mobile station and the control channel, then that control channel is marked a ineligible in the neighbor list and when the re-selection process is repeated filth the same neighbor list, since that control channel has been marked ineligible it will not be a factor in the selection of a primary candidate control channel.

Examples of incompatibility are as follows. The mobile station may not have any access privileges with regard to private systems. In this case, the mobile station would scan the neighbor list and mark as ineligible any control channel identified as being related to a private system since the mobile station will not be permitted access to such stations. Alternatively, the mobile station may have access to only one private system. In such a case, then if a primary candidate control channel is a private system channel and the mobile station is not determined to have access to that particular private system, then the attempt to re-select to the private system will fail and the neighbor list will be modified to reflect that this channel is not eligible for analysis in a subsequent re-selection process.

BRIEF DESCRIPTION OF THE DRAWINGS

FIG. 2 illustrates a table of information employed by a mobile station in the environment of FIG. 1.

DETAILED DESCRIPTION

Figure 1:
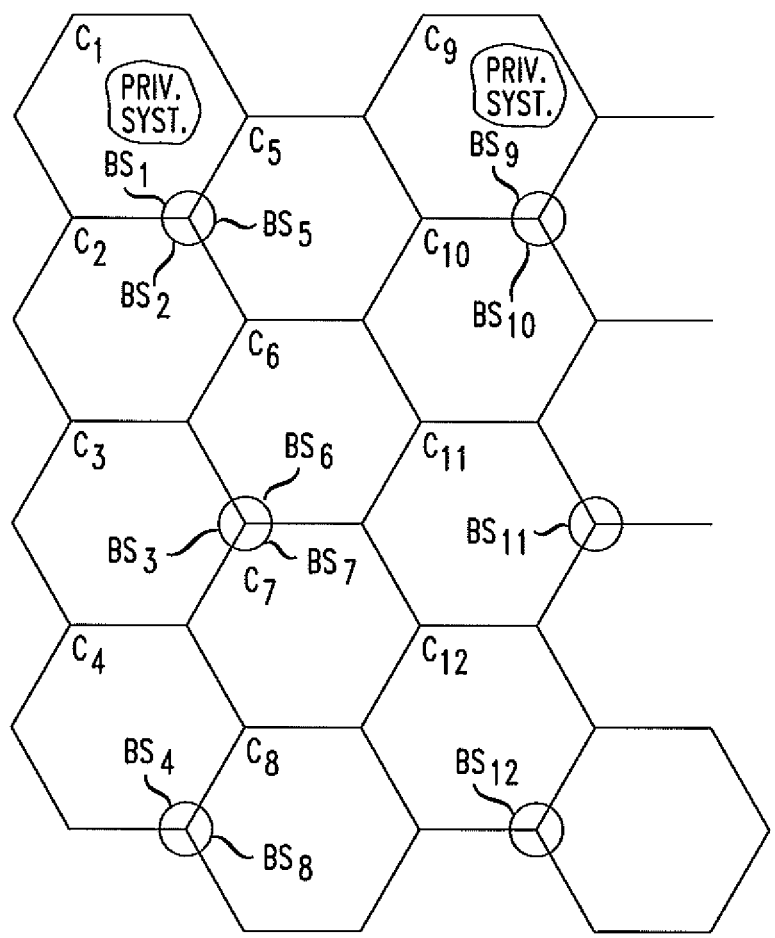
FIG. 1 illustrates, in a high level schematic, form a wireless system in accordance with an exemplary embodiment of the disclosure.

As described above, the mobile station may be used in a wireless embodiment which is shows schematically in FIG. 1. A cellular phone providing voice service could constitute such a station. A plurality of cells $C_1$ to $C_{12}$ are serviced by respective base station $BS_1$ to $BS_{12}$. When the mobile station is in cell $C_1$, it may be camped on to the control channel from base station $BS_1$. The control channel $BS_1$ will transmit a list of neighboring control channels. The list will include control channels associated with base station $BS_2$, base station $BS_5$ and base stations that service other cells adjacent to cell $C_1$ Furthermore, the list of neighboring channels may include a list of control channels that are related to fax services or data services. In addition, the list may include a control channel associated with a private system such as that shown in cell $C_1$. Typically such a private system is overlaid by the public system so that the area covered by the private system is covered by both the public and private system, but access to the private system itself, for example, a wireless PBX on a party's premises, is not permissible except by members of that private system.

Figure 4:
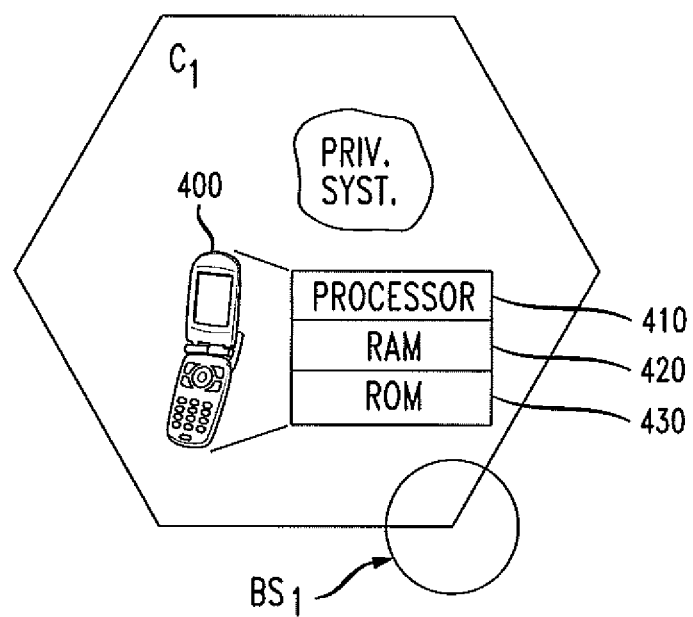
FIG. 4 illustrates a mobile station in accordance with an embodiment of the present invention.

When the mobile station receives the neighbor list from the control channel on which it is camped, it stores that neighbor list in memory. The mobile station may be a cellular phone which complies with the IS-136 standards. Such a mobile communications device 400 as illustrated if FIG. 4 includes processing capabilities 410 and memory, both read only (ROM) 420 and random access memory (RAM) 430. The ROM 420 stores control programs for operating the device while the RAM 430 stores dynamic information which can be updated over time, such as the neighbor list transmitted from a control channel on which the station is camped. In its memory the mobile station 400 would track the identification of the control channels included in the list. Furthermore, in compliance with the IS-136 standard, the neighbor list would also provide certain parameter information which relates to the characteristics of the control channel. For example, the parameter information would indicate whether a control channel is associated with a private, a public, or a semi-private system. The identification of the particular system to which the control channel is associated would not necessarily be presented in the neighbor list. Instead only the type of system to which the control channel is associated would be supplied. Similarly, the parameter information could indicate whether the control channel is designed to provide voice service, data service, or fax service. Other parameter information which defines the characteristics of the control channel could also be supplied with a neighbor list, (e.g., cell type, protocol version, cell sync, etc.).

An example of a correlation of the information presented by the control channel, in which the mobile station is camped, is shown in FIG. 2. In this tabular representation of the data which might be stored in the mobile station, a first control channel in the list has an ID of "XXXXX". The parameter information indicates that this control channel is associated with a private system and provides voice services. The control channel identified by "YYYYY" is by contrast associated with the public system while still providing voice services. The control channel "ZZZZZ" is also associated with the public system, but provides fax services. Similar information would be provided for each control channel identified in the neighbor list provided by the control channel on which the mobile station is camped.

This parameter information can then be used to modify or control the process by which an alternative control channel can be selected.

Figure 3:
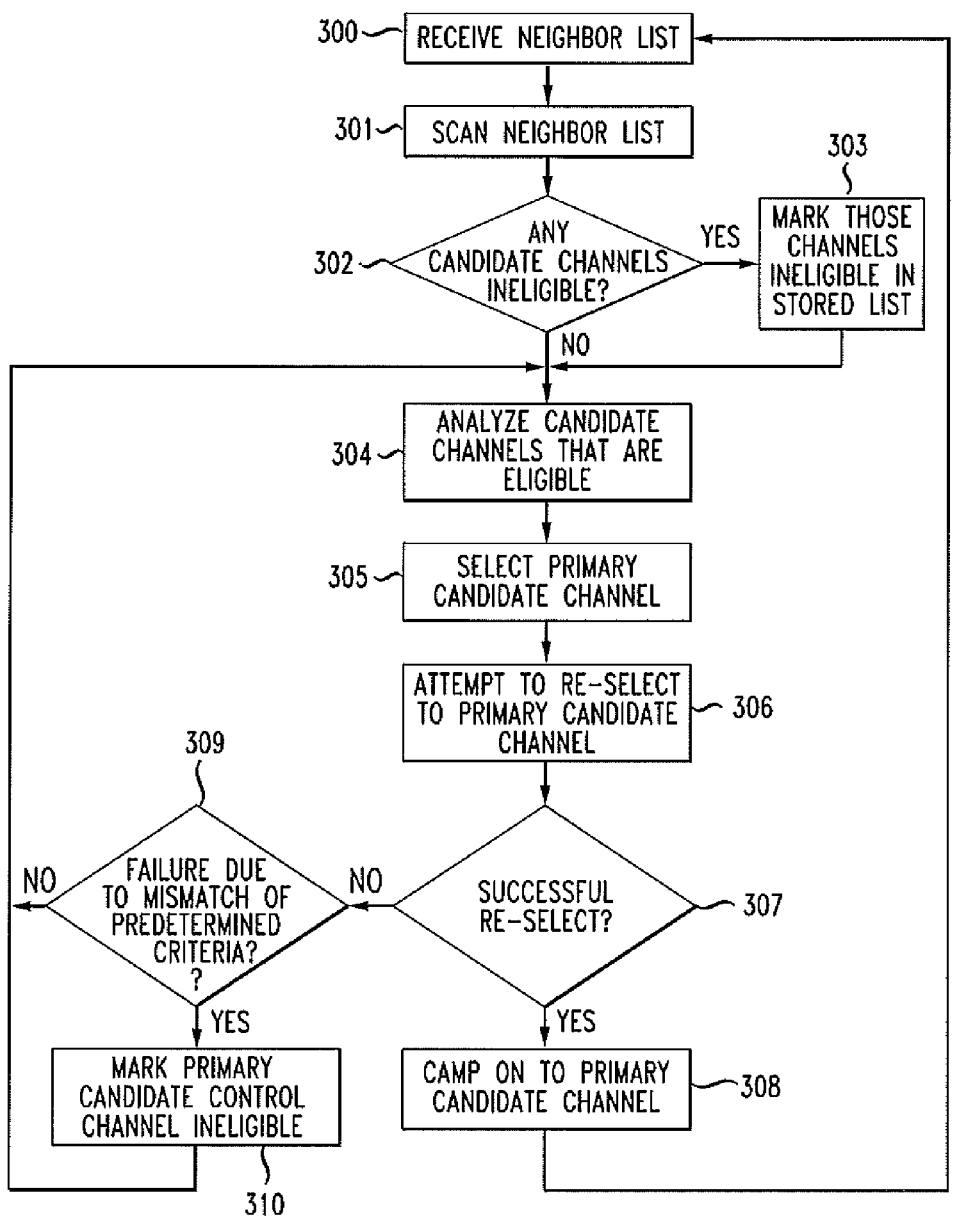
FIG. 3 illustrates a process flow for re-selection of a control channel in the wireless channel of FIG. 1 in accordance with an exemplary embodiment of the disclosure.

A flow chart illustrating the process for controlling re-selection using the received neighbor list is illustrated in FIG. 3.

In step 300, the mobile station 400 receives the neighbor list from the control channel on which it is presently camped. In step 301, the mobile station 400 processor 420 scans the neighbor list in accordance with a stored control program and examines the entries in the list to determine whether any of the control channels (the candidate control channels) are ineligible because of a lack of compatibility between the mobile station and the control station. As an example, incompatibility could arise where the mobile station 400 does not have access to any private network or system. The mobile station memory 420, 430 would store system IDS for those systems with which the mobile station is allowed to communicate. It could also store a flag indicating whether the mobile station has access to any private system. Under those circumstances where there is access to private systems, any control channel which is related to a private system is incompatible with the mobile station. Similarly, if the mobile station seeks voice services, then any control channel associated with fax or data services would be incompatible with the mobile station.

Once a candidate control channel is detected or recognized to be ineligible in Step 302, then each of those ineligible control channels is marked as ineligible in the neighbor list. In particular, the processor in the mobile station modifies the neighbor list to somehow mark a control channel as ineligible. One way of doing this is to include an eligibility flag in the neighbor list. All control channels in the neighbor list would initially haste their eligibility flags set as indicated an eligible control channel. Then, when a control channel is marked as ineligible the flag would be reset to an ineligible state. Alternatively, it is possible that other steps could be taken to effectively remove the ineligible control channels from subsequent consideration in the re-selection process. In Step 304, a process, known in the prior art, is initiated for studying or analyzing candidate channels to try to select the optimal candidate channel for re-selection. This process is referred to in FIG. 3, as "analyzing candidate control channels." That step of analysis is limited to only those control channels which are deemed to be eligible. That is, if the eligibility status reflected in the neighbor list in Step 303 indicated that a control channel is ineligible, then that control channel mill not be included in the analysis operation beyond that point. It will, in essence, be ignored and will not figure in the calculations of determining the best candidate control channel for the re-selection process. In the analysis operation, each of the eligible control channels will be tested for certain criteria such as RF level. Once each of the eligible control channels is tested a primary candidate channel is selected (Step 305) as the processor identifies which of the eligible control channels is the best candidate for re-selection based on the test results obtained during the analysis of Step 304. This may arise under the circumstance where the processor will run tests on each of the eligible control channels. As an example a result of the tests on such things as the RF level in Step 305 the processor may determine that one or more of the candidate control channel satisfy certain criteria to be selectable by the mobile station. Then, in step 305 the processor could go through this subset of selectable candidate control channels and select the optimal or primary candidate control channel based on the parameters associated with that control channel. Thus, a primary candidate channel could be as in step 305. Once such a primary candidate channel is identified, the mobile station attempts to re-select to the primary candidate channel in step 306. If the re-selection attempt is successful as detected in step 307, then the mobile station camps onto the primary candidate channel in step 308 and receives a new neighbor list from the primary candidate control channel identifying neighbors associated with that control channel. If, however, the attempt to re-select is unsuccessful, then the processor can make a determination as to why the re-selection attempt failed. If the failure is due to a mismatch of certain predetermined criteria as referred to in step 309, then the channel identified as the primary candidate control channel could then be treated as an ineligible candidate channel. The eligibility status within the neighbor list would be modified to reflect this change of status and the processor could then resume the re-selection process from step 304, where the processor could begin again the analysis of the candidate control channels focusing only on those which remain as eligible control channels. The system will then select another primary candidate and attempt to reselect to that second primary candidate channel. This process will continue until the mobile station camps onto an alternative control channel.

As has been described above, a candidate channel could be ineligible because the control channel is associated with a private system, whereas the mobile station is not affiliated with any private system. Furthermore, a control channel may be deemed ineligible because of the tyke of service that it provides and the lack of compatibility between that service and the service of the mobile station. The predetermined criteria referred to in connection with step 309 can be any condition that causes the failure of a reselect attempt. Typically one such event would be where the primary candidate channel is associated with a private system and the mobile station is also associated with a private system. In that circumstance, then, the primary candidate channel would not then be marked ineligible in step 303. Then, during the reselect attempt the private system identifier associated with the primary candidate channel would be provided to the mobile station. If the mobile station private system identifier stored in memory does not match the private system ID received from the primary candidate channel during the attempt to re-select, then the mobile station will not get access to the private system associated with that primary, candidate channel. Therefore, there is an incompatibility between the mobile station and the system associated with that primary candidate channel. In view of this incompatibility, it is consistent with the exemplary embodiment to now mark this primary control channel as ineligible as in step 310. Then if it is necessary to analyze the neighbor list again (step 304) to find a candidate channel for re-selection, the newly designated ineligible control channel will not be analyzed.

In accordance with the alternative embodiments, other parameter information associated with a control channel could be used to determine whether the control channel is eligible for re-selection by this particular mobile station. Furthermore, modifications to the process of FIG. 3 are also possible. For instance, in one variation steps 301, 302 and 303 would be eliminated, that is the processor would not do any preliminary examination of the neighbor list to determine if any candidate channels are ineligible. Instead, the system would simply rely on marking primary candidate channels as ineligible for subsequent re-selection attempts. Alternatively, the control method of an exemplary embodiment could rely simply on the ineligibility determination made at the beginning of the analysis process and not dynamically evaluate ineligibility based on whether an attempt to reselect a particular candidate channel was successful. Thus steps 309 and 310 could be eliminated and benefits would still be obtained from the remaining process.

Since an exemplary embodiment includes a method by which the mobile station selects an appropriate re-selection candidate and since it is implemented using software running on a processor within the mobile station, it must be recognized that variations on the order in which certain steps are performed and the specific techniques or parameters involved in the process could be modified while still falling within the spirit of the disclosure. For example, it is conceivable that in one variation the station microprocessor could scan the entire list of neighbors and adjust the eligibility status where appropriate for all ineligible control channels before proceeding with the analysis of the eligible control channels. In an alternative embodiment, the first time through the neighbor list the processor could first determine whether a given control channel is eligible and then, if it is eligible, perform the analysis with respect to that control channel. Then the microprocessor would turn to the next control channel on the list, determine whether it should be considered eligible and if so conduct the evaluation with respect to that control channel and so on. In this second configuration, the processor does not scan the entire list before beginning the evaluation process. Instead, in combines the marking and evaluation steps.

Other modifications might include other techniques for marking a control channel as ineligible.

In yet another embodiment it is conceivable that the mobile station could select for analysis a subset of the control channels form the neighbor list; the subset being based on any one or combination of parameters.

In accordance with an exemplary embodiment, a mobile station can more optimally control the process by which it selects alternative control channels. It provides the mobile station with a way to focus only on those candidate control channels with which the mobile station can effectively communicate.

What is claimed is:

1. A mobile station, comprising:
a processor; and a memory having stored thereon program instructions which, when executed by the processor, cause the processor to perform operations comprising:
determining whether any candidate control channels, of a list of candidate control channels, are ineligible for selection by belonging to a private network to which the mobile station is not permitted access;
analyzing candidate control channels not determined to be ineligible for selection to identify a primary candidate control channel;
attempting to select the primary candidate control channel;
responsive to a failure in an attempt to select the primary candidate control channel, determining whether the failure to select is attributable to an incompatibility; and
responsive to determining that the failure to select is attributable to an incompatibility, marking the primary candidate control channel as ineligible.

2. The mobile station of claim 1, wherein the incompatibility comprises the mobile station being incompatible with a particular private network to which the primary candidate control channel corresponds.

3. The mobile station of claim 1, the memory further having stored thereon program instructions which, when executed by the processor, cause the processor to perform operations comprising:
after failing to select the primary candidate control channel:
determining whether there are any secondary primary candidate control channels; and
responsive to determining that there is a secondary primary candidate control channel, attempting to select the secondary primary candidate control channel.

4. The mobile station of claim 1, wherein the incompatibility comprises:
a mismatch between a service sought by the mobile station and a service provided by the primary candidate control channel.

5. A mobile station, comprising:
a processor;
a memory having stored thereon program instructions which, when executed by the processor, cause the processor to perform operations comprising:
determining whether any candidate control channels, of a list of candidate control channels, are incompatible with the mobile station by belonging to a private network to which the mobile station is not permitted access;
determining whether any of the candidate control channels that do not belong to the private network to which the mobile station is not permitted access are incompatible; and
responsive to determining that a candidate control channel is incompatible, marking the candidate control channel determined to be incompatible as ineligible, wherein once the candidate control channel is marked ineligible, the marked candidate control channel is not considered for selection in a selection process.

6. The mobile station of claim 5, wherein the candidate control channels that do not belong to the private network to which the mobile station is not permitted access are determined to be incompatible with the mobile station due to a mismatch between a service or system provided by a candidate control channel and a corresponding service or system associated with the mobile station.

7. A mobile station, comprising:
a processor;
a memory configured to store data identifying a plurality of candidate control channels and a parameter associated with each of the plurality of candidate control channels, the memory further having stored thereon program instructions which, when executed by the processor, cause the processor to perform operations comprising:
determining whether the parameter associated with of a candidate control channel is incompatible with a corresponding parameter of the mobile station; and
responsive to determining that the parameter associated with a candidate control channel is incompatible with the corresponding parameter of the mobile station, marking, as ineligible, the candidate control channel for which the parameter is determined to be incompatible with the corresponding parameter of the mobile station.

8. The mobile station of claim 7, wherein the data is in the form of a list.

9. The mobile station of claim 7, wherein the parameter is selected from a group of parameters consisting of a system type, a service type, a cell type, a protocol version, and a cell sync.

10. The mobile station of claim 9, wherein the parameter is a system type selected from a group of system types consisting of private, public, and semi-private.

11. The mobile station of claim 9, wherein the parameter is a service type selected from a group of service types consisting of voice service, data service, and facsimile service.

12. The mobile station of claim 7, wherein the program instructions, in causing the processor to perform determining whether the parameter associated with a candidate control channel is incompatible with a corresponding parameter of the mobile station, cause the processor to perform scanning the data in accordance with a control program stored in the memory.

13. The mobile station of claim 7, wherein the program instructions, in causing the processor to perform marking, as ineligible, the candidate control channel for which the parameter is incompatible with the corresponding parameter of the mobile station, cause the processor to perform setting an eligibility flag associated with the ineligible candidate control channel to an ineligible state.

14. The mobile station of claim 7, wherein the program instructions, in causing the processor to perform marking, as ineligible, the candidate control channel for which the parameter is incompatible with the corresponding parameter of the mobile station, cause the processor to perform removing the candidate control channel that is determined to be incompatible with the mobile station from consideration for selection as a primary control channel.

15. The mobile station of claim 7, the memory further having stored thereon program instructions which, when executed by the processor, cause the processor to perform operations comprising:
identifying a primary control channel among any of the candidate control channels for which the identifying data was not marked ineligible;
attempting to select the identified primary control channel;
responsive to successfully selecting the identified primary control channel, camping on the identified primary control channel; and
responsive to unsuccessfully selecting the identified primary control channel due to an incompatibility between the mobile station and the identified primary control channel, marking as ineligible the identified primary control channel.

16. A method associated with a mobile station storing data identifying a plurality of candidate control channels, the mobile station and each of the plurality of candidate control channels having a service type and a system type associated therewith, the data further identifying the service type and/or the system type of each of the plurality of candidate control channels, the method comprising:

determining, by a processor, whether the service type or the system type of each of the plurality of candidate control channels is incompatible with the respective service type or system type associated with the mobile station; and responsive to determining that the service type or the system type of a candidate control channel is incompatible with the respective service type or system type associated with the mobile station, marking, as ineligible, the candidate control channel for which the service type or the system type associated therewith is determined to be incompatible with the service type or the system type associated with the mobile station.

17. The method of claim 16, wherein the data is in the form of a list, and the method further comprises:

determining by the processor, whether any of the plurality of candidate control channels are ineligible for selection by belonging to a private network to which the mobile station is not permitted access;

analyzing, by the processor, candidate control channels not determined to be ineligible for selection to identify a primary candidate control channel;

attempting to select the primary candidate control channel, and responsive to a failure in an attempt to select the primary candidate control channel, determining whether the failure to select is attributable to an incompatibility; and responsive determining that the failure to select is attributable to an incompatibility, marking the primary candidate control channel as ineligible.

18. The method of claim 16, wherein marking includes removing each of the plurality of candidate control channels that are determined to be incompatible with the mobile station from consideration in a selection process.

19. The method of claim 16, further comprising:

identifying a primary control channel among any of the candidate control channels not marked ineligible;

attempting to select the identified primary control channel;

responsive to successfully selecting the identified primary control channel, camping on the identified primary control channel; and responsive to unsuccessfully selecting the identified primary control channel due to an incompatibility between the mobile station and the identified primary control channel, marking as ineligible the identified primary control channel.

20. The method of claim 19, further comprising:

responsive to unsuccessfully selecting the identified primary control channel, identifying a secondary primary control channel, attempting to select the identified secondary primary control channel, camping on the identified secondary primary control channel responsive to successfully selecting the identified secondary primary control channel, and marking as ineligible the identified secondary primary control channel responsive to unsuccessfully selecting the identified secondary primary control channel.

21. The method of claim 17, further comprising:

determining whether any candidate control channels, of a list of candidate control channels, are ineligible for selection by belonging to a private network to which the mobile station is not permitted access.

\* \* \* \* \*